(12) United States Patent
Lee et al.

(10) Patent No.: US 10,593,676 B2
(45) Date of Patent: Mar. 17, 2020

(54) MEMORY DEVICE AND METHOD FOR MANUFACTURING THE SAME

(71) Applicant: Winbond Electronics Corp., Taichung (TW)

(72) Inventors: Shu-Ming Lee, Taichung (TW); Tzu-Ming Ou Yang, Tainan (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/170,696

(22) Filed: Oct. 25, 2018

(65) Prior Publication Data
US 2019/0139961 A1 May 9, 2019

(30) Foreign Application Priority Data
Nov. 8, 2017 (CN) .......................... 2017 1 1088409

(51) Int. Cl.
*H01L 27/108* (2006.01)
(52) U.S. Cl.
CPC .... *H01L 27/1085* (2013.01); *H01L 27/10805* (2013.01); *H01L 27/10808* (2013.01); *H01L 27/10855* (2013.01); *H01L 27/10873* (2013.01); *H01L 27/10894* (2013.01)
(58) Field of Classification Search
CPC .......... H01L 27/1085; H01L 27/10805; H01L 27/10808; H01L 27/10855; H01L 27/10873; H01L 27/10894
See application file for complete search history.

(56) References Cited

U.S. PATENT DOCUMENTS

| | | | | | |
|---|---|---|---|---|---|
| 5,688,713 | A | * | 11/1997 | Linliu | ............... H01L 27/10817 438/253 |
| 6,074,908 | A | * | 6/2000 | Huang | .............. H01L 27/10814 257/E21.656 |
| 6,344,692 | B1 | * | 2/2002 | Ikemasu | ........... H01L 21/76802 257/296 |
| 6,780,739 | B1 | | 8/2004 | Mao et al. | |
| 2002/0137281 | A1 | * | 9/2002 | Watanabe | ......... H01L 27/10852 438/253 |
| 2010/0015789 | A1 | | 1/2010 | Moritoki | |
| 2011/0033994 | A1 | | 2/2011 | Fujimoto et al. | |

* cited by examiner

*Primary Examiner* — Mark W Tornow
(74) *Attorney, Agent, or Firm* — Muncy, Geissler, Olds & Lowe, P.C.

(57) ABSTRACT

A memory device and a method for manufacturing the memory device are provided. The memory device includes two first gate structures and a multilayer insulating structure. The multilayer insulating structure includes a first insulating layer, a second insulating layer, a third insulating layer, and a fourth insulating layer sequentially from bottom to top. The width of the second insulating layer is equal to that of the third insulating layer, and smaller than that of the first insulating layer. The width of the bottom surface of the fourth insulating layer is greater than the width of the top surface of the third insulating layer. The memory device includes a capacitor contact plug formed between the first gate structures. The capacitor contact plug includes a first contact element, a buffering layer, and a second contact element. The second contact element has a top surface wider than its bottom surface.

18 Claims, 7 Drawing Sheets

MEMORY DEVICE AND METHOD FOR MANUFACTURING THE SAME

CROSS REFERENCE TO RELATED APPLICATIONS

This Application claims priority of China Patent Application No. 201711088409.3, filed on Nov. 8, 2017, the entirety of which is incorporated by reference herein.

BACKGROUND

Field of the Disclosure

The present disclosure relates to a memory device, and in particular it relates to a memory device having self-aligned contact structures and a method for manufacturing the memory device.

Description of the Related Art

With the increasing popularity of portable electronic products, consumer demand for memory devices is also increasing. All portable electronic products (such as digital cameras, notebook computers, mobile phones, etc.) need a lightweight and reliable memory device for the storage and transmission of data.

Dynamic random access memory (DRAM) has many advantages, such as small volume, large memory capacity, high speed of reading and writing, and long product life. Therefore, it is widely used in a variety of electronic products.

With the trend of miniaturization of electronic products, there is also demand for miniaturization of memory devices. However, with the miniaturization of memory devices, it becomes more difficult to improve the yield of the product. Therefore, there is still a demand for memory devices, and their manufacturing methods, having a high yield.

BRIEF SUMMARY

The disclosure provides a memory device. The memory device includes a substrate including an array region and a peripheral region, two first gate structures formed in the array region, and a multilayer insulating structure formed on the first gate structures. The multilayer insulating structure includes a first insulating layer formed on and covering the first gate structures, a second insulating layer formed on the first insulating layer, a third insulating layer formed on the second insulating layer, and a fourth insulating layer formed on the third insulating layer. A width of the second insulating layer is smaller than a width of the first insulating layer, and a width of the third insulating layer is the same as the width of the second insulating layer. A width of a bottom surface of the fourth insulating layer is greater than a width of a top surface of the third insulating layer. The memory device also includes a capacitor contact plug formed between the first gate structures. The capacitor contact plug includes a first contact element formed on the substrate, a second contact element formed on the first contact element, and a buffer layer formed between the first contact element and the second contact element. A width of a top surface of the second contact element is greater than a width of a bottom surface of the second contact element.

The disclosure also provides a method for manufacturing a memory device. The method includes preparing a substrate including an array region and a peripheral region, forming two first gate structures in the array region, and forming a multilayer insulating structure on the first gate structure. The multilayer insulating structure includes a first insulating layer formed on and covering the first gate structures, a second insulating layer formed on the first insulating layer, a third insulating layer formed on the second insulating layer, and a fourth insulating layer formed on the third insulating layer. A width of the second insulating layer is smaller than a width of the first insulating layer, and a width of the third insulating layer is the same as the width of the second insulating layer. A width of a bottom surface of the fourth insulating layer is greater than a width of a top surface of the third insulating layer. The method also includes forming a capacitor contact plug between the first gate structures. The capacitor contact plug includes a first contact element formed on the substrate, a second contact element formed on the first contact element, and a buffer layer formed between the first contact element and the second contact element. A width of a top surface of the second contact element is greater than a width of a bottom surface of the second contact element.

A detailed description is given in the following embodiments with reference to the accompanying drawings.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

In some embodiments of the disclosure, a memory device and a method for manufacturing the memory device are provided. FIGS. 1A-1L show cross-sectional views of various stages of manufacturing a memory device 100 in accordance with some embodiments.

Figure 1A:
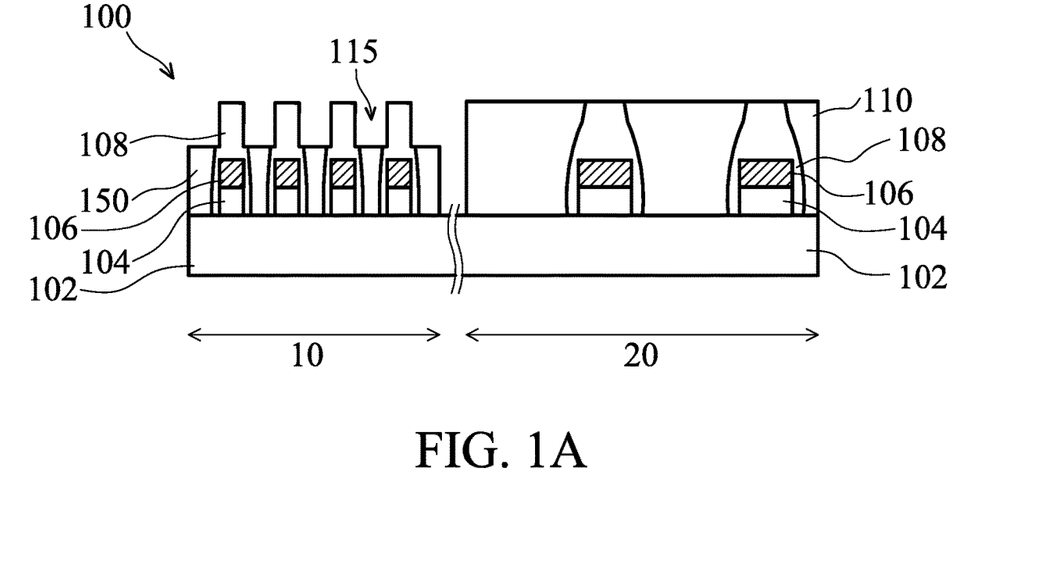
FIGS. 1A-1L show cross-sectional views of various stages of manufacturing a memory device in accordance with some embodiments.

Referring to FIG. 1A, the memory device 100 includes a substrate 102, and the substrate 102 includes an array region 10 and a peripheral region 20. A plurality of first gate structures are formed in the array region 10 of the substrate 102. The first gate structure includes a polycrystalline silicon gate 104 and a metal gate 106 stacked over the polycrystalline silicon gate 104. Furthermore, a plurality of second gate structures are formed in the peripheral region 20 of the substrate 102. The second gate structure includes a polycrystalline silicon gate 104 and a metal gate 106 stacked over the polycrystalline silicon gate 104.

The material of the substrate 102 may include silicon, silicon-containing semiconductor, silicon on insulator (SOI), another applicable material, or a combination thereof. The material of the metal gate 106 may be, for example, tungsten, aluminum, copper, gold, silver, tantalum, hafnium, zirconium, an alloy thereof, or another applicable metal material.

After forming the first gate structures and the second gate structures, a first insulating layer 108 is formed on and covers the first gate structures and the second gate structures. Then, the first insulating layer 108 is patterned to form openings 115 between the first gate structures and between the second gate structures, respectively, as shown in FIG. 1A. The first insulating layer 108 may be formed and patterned by any conventional technique, and the details will not be described here.

Then, first conductive material is deposited in the openings 115 between the first gate structures to form first contact elements 150 in the array region 10. The first conductive material may be non-metallic conductive material and may include, for example, but are not limited to, doped or undoped monocrystalline silicon, doped or undoped polycrystalline silicon, or doped or undoped amorphous silicon. The first conductive material may be deposited by any conventional technique, and the details will not be described here.

Before the first contact elements 150 are formed, a protection layer 110 may be formed in the peripheral region 20. The protection layer 110 covers the first insulating layer 108 and the second gate structures and fills the openings 115 between the first gate structures, in order to avoid the conductive material depositing on the peripheral region 20. After the first contact elements 150 are formed, a portion of the protection layer 110 on the peripheral region 20 may be removed to expose the first insulating layer 108 by the planarization process or etching process. As a result, the structure as shown in FIG. 1A may be obtained.

Figure 1B:
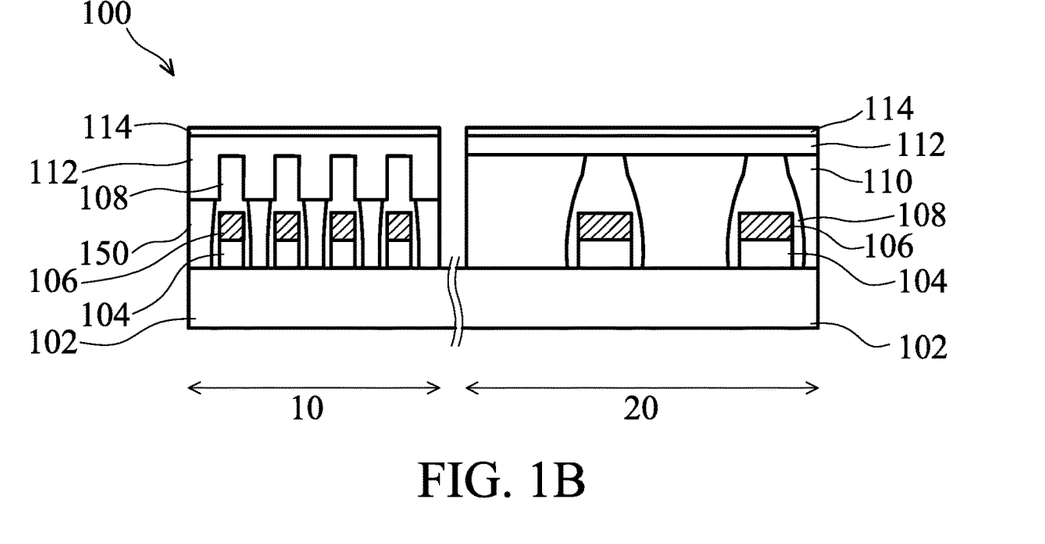

Referring to FIG. 1B, a second insulating layer 112 is formed on the first insulating layer and fills in to the openings in the array region. Then, a planarization process may be performed optionally. The top surface of the second insulating layer 112 in the array region 10 is substantially level with the top surface of the second insulating layer 112 in the peripheral region 20. In other words, the top surface of the second insulating layer 112 is substantially flat. Then, a third insulating layer 114 is formed on the second insulating layer 112, and top surface of the third insulating layer 114 in the array region 10 is substantially level with the top surface of the third insulating layer 114 in the peripheral region 20. In other words, the third insulating layer 114 has a substantially uniform thickness in the array region 10 and in the peripheral region 20.

Figure 1C:
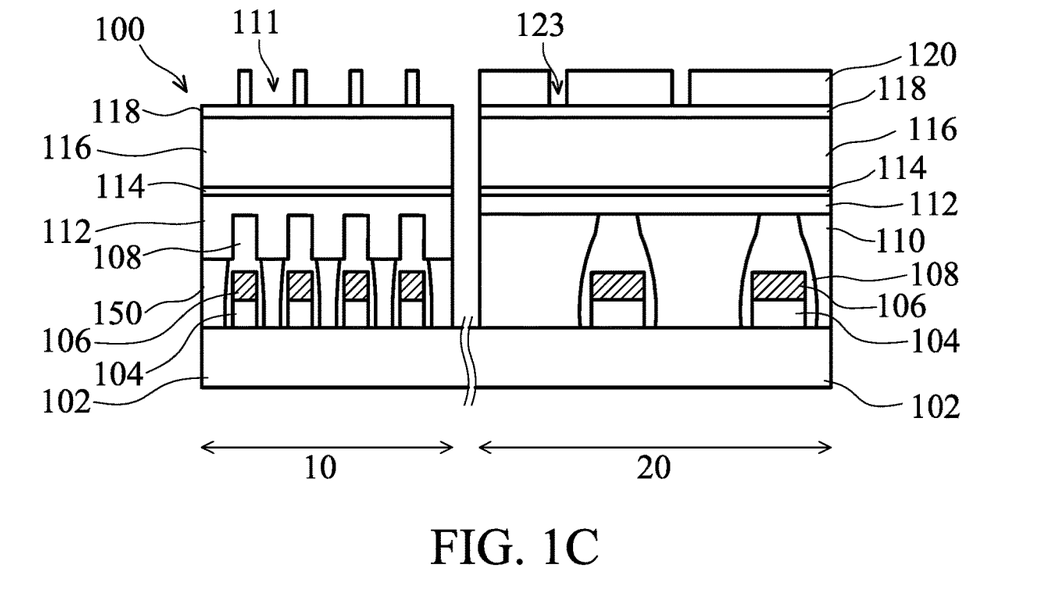

Referring to FIG. 1C, a first mask layer 116, a second mask layer 118, and a photoresist layer 120 are formed on the third insulating layer 114. In this embodiment, the first mask layer 116 and the second mask layer 118 are used as the mask for the etching process. However, this is not intended to be limiting, and a single layer or multilayer mask may be used optionally. The first mask layer 116 and the second mask layer 118 may independently include carbides, nitrides, carbonitrides, oxynitrides, or another applicable material.

Then, the photoresist layer 120 is patterned to form a plurality of openings 111 and a plurality of openings 123 in the array region 10 and the peripheral region 20, respectively. As shown in FIG. 1C, each one of the openings 111 is located on one of the openings 115, and the position of the opening 111 corresponds to the position of the opening 115. Furthermore, the width of the opening 111 is wider than the width of the opening 115. In addition, the position of the opening 123 corresponds to both sides of the second gate structure.

Figure 1D:
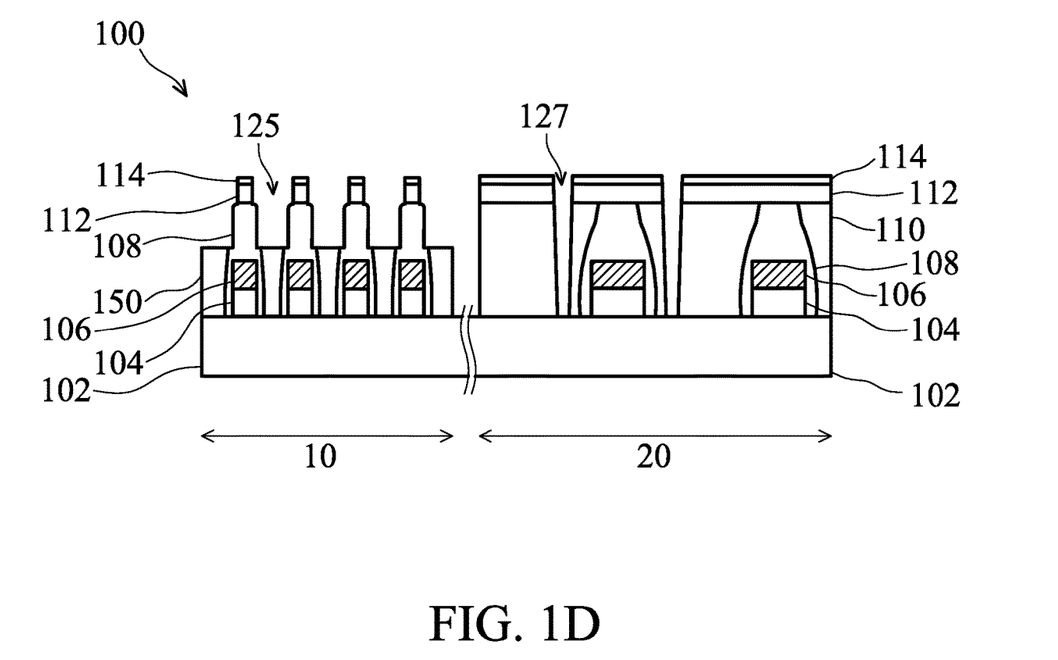

Referring to the FIG. 1C and FIG. 1D, a first etching process is performed to etch the layers under the openings 111 and the layers under the openings 123, respectively, and the third insulating layer 114 is patterned. In order to remove the third insulating layer 114 effectively, the etching rate of the third insulating layer 114 in the first etching process is high. The first etching process may be dry etching, wet etching, or a combination thereof.

Then, a second etching process is performed to remove a portion of the second insulating layer 112 and a portion of the first insulating layer 108 by using the patterned third insulating layer 114 as a mask. Self-aligned contact holes 125 are formed between the first gate structures, and openings 127 are formed at both sides of the second gate structure.

In order to use the third insulating layer 114 as an etching mask, the second etching process has a high etching selectivity for the second insulating layer 112 and the third insulating layer 114. In other words, during the second etching process, the etching rate R1 of the second insulating layer 112 is greater than the etching rate R2 of the third insulating layer 114. In addition, in order to form the self-aligned contact holes 125 as shown in FIG. 1D, the second etching process has a high etching selectivity for the second insulating layer 112 and the first insulating layer 108. In other words, during the second etching process, the etching rate R1 of the second insulating layer 112 is greater than the etching rate R3 of the first insulating layer 108.

The second etching process may be a dry etching process, a wet etching process, or a combination thereof. During the second etching process, because the second etching process has a high etching selectivity for the second insulating layer 112 and the third insulating layer 114, the upper portion of the self-aligned contact holes 125 may have substantial vertical sidewalls. When the etching depth reaches the top surface of the first insulating layer 108, only a few portions of the first insulating layer 108 is removed since the second etching process has a high etching selectivity for the second insulating layer 112 and the first insulating layer 108. In other words, the second etching process can completely remove the second insulating layer 112 located at the lower portion of the self-aligned contact holes 125 without changing the shape of the first insulating layer 108.

In some embodiments, during the second etching process, the ratio R1/R2 of the etching rate R1 of the second insulating layer 112 to the etching rate R2 of third insulating layer 114 is 5-40. In other embodiments, the ratio R1/R2 is 10-40. In yet other embodiments, the ratio R1/R2 is 20-30. In some embodiments, during the second etching process, the ratio R1/R3 of the etching rate R1 of the second insulating layer 112 to the etching rate R3 of the first insulating layer 108 is 10-50. In other embodiments, the ratio R1/R3 is 10-40. In yet other embodiments, the ratio R1/R3 is 20-30.

The first insulating layer 108, the second insulating layer 112, and the third insulating layer 114 may independently include oxides, nitrides, oxynitrides, metal oxides, a combination thereof, or another applicable insulating material. The first insulating layer 108, the second insulating layer 112, and the third insulating layer 114 may be made of applicable materials, so that the etching rate of each insulating layer during the second etching process may be respectively adjusted to the desired range.

In some embodiments, the first insulating layer 108 and the third insulating layer 114 may be nitrides (such as, silicon nitride), and the second insulating layer 112 may be oxides (such as, silicon oxide). In other embodiments, as long as the ratio R1/R2 and the ratio R1/R3 are 5-40 and 10-50, respectively, the first insulating layer 108 and the third insulating layer 114 may be different materials.

In order to make the ratio R1/R2 and the ratio R1/R3 be 5-40 and 10-50, respectively, applicable etching process and/or etching parameters may also be selected. In some embodiments, the second etching process is dry etching, and the parameters that can be used to adjust the etching selectivity include, but are not limited to, for example, the composition of the etching gas, the flow rate of the etching gas, the etching temperature, or the etching power.

After the second etching process, the width of the third insulating layer 114 is substantially the same as the width of the second insulating layer 112, and the width of the third insulating layer 114 is smaller than the width of the underlying first insulating layer 108, as shown in FIG. 1D. In other words, the cross-sectional profile of the resulted self-aligned contact hole 125 has a wider upper portion and a narrower lower portion. Such self-aligned contact hole 125 is helpful to improve the balance of yield and critical dimensions of the memory device, and the details will be discussed in the following paragraphs.

Figure 1E:
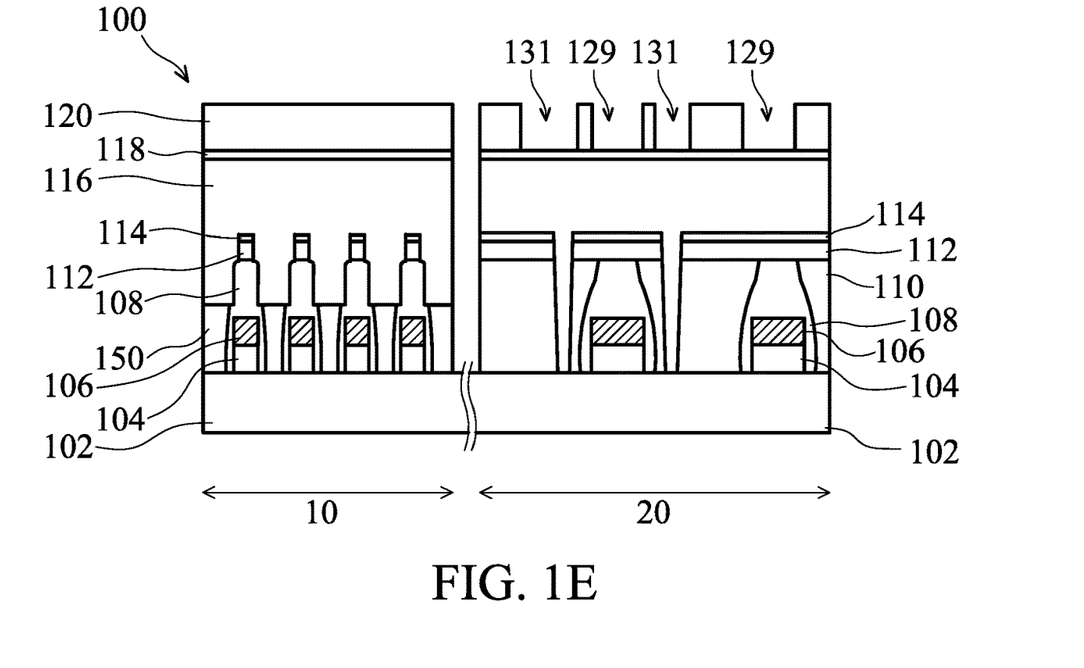

Referring to FIG. 1E, the first mask layer 116, the second mask layer 118, and the photoresist layer 120 are formed in the array region 10 and the peripheral region 20. Then, the photoresist layer 120 in the peripheral region 20 is patterned to form a plurality of a plurality of openings 129 and a plurality of openings 131 in the peripheral region 20. The opening 131 is located on the opening 127, and the position of the opening 131 corresponds to the position of the opening 127. Furthermore, the width of the opening 131 is greater than the width of the opening 127. In addition, the opening 129 is located on the second gate structure, and the position of the opening 129 corresponds to the position of the second gate structure.

Figure 1F:
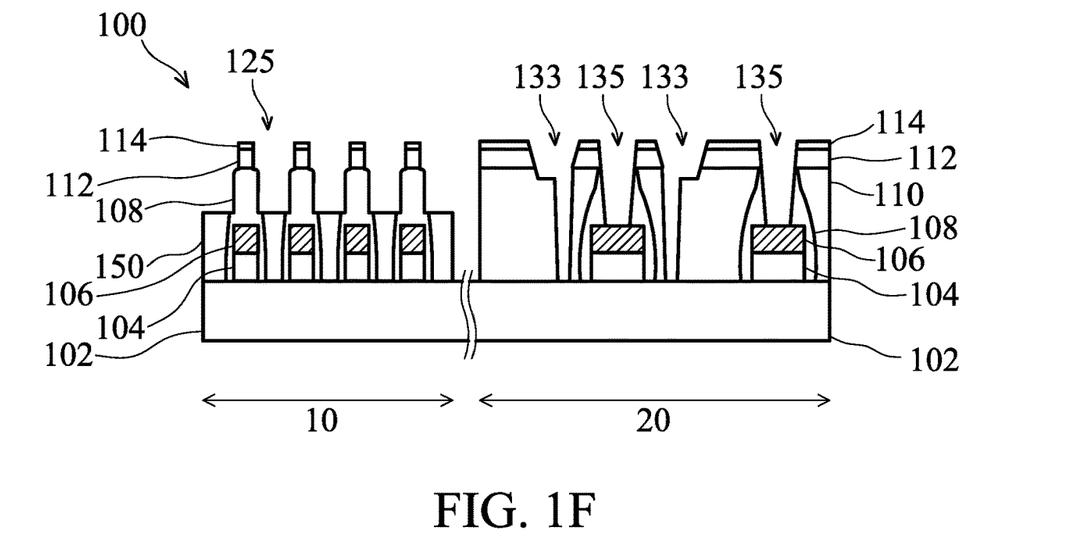

Referring to FIG. 1E and FIG. 1F, a third etching process is performed to respectively etch the layers under the openings 129 and the openings 131, so that gate contact holes 135 are formed on the second gate structures, and source/drain contact holes 133 are formed at both sides of the second gate structures. In addition, after the third etching process, the self-aligned contact holes 125 in the array region 10 is exposed. The third etching process may be the same as or similar to the first etching process and/or the second etching process, and the details will not be repeated here.

Figure 1G:
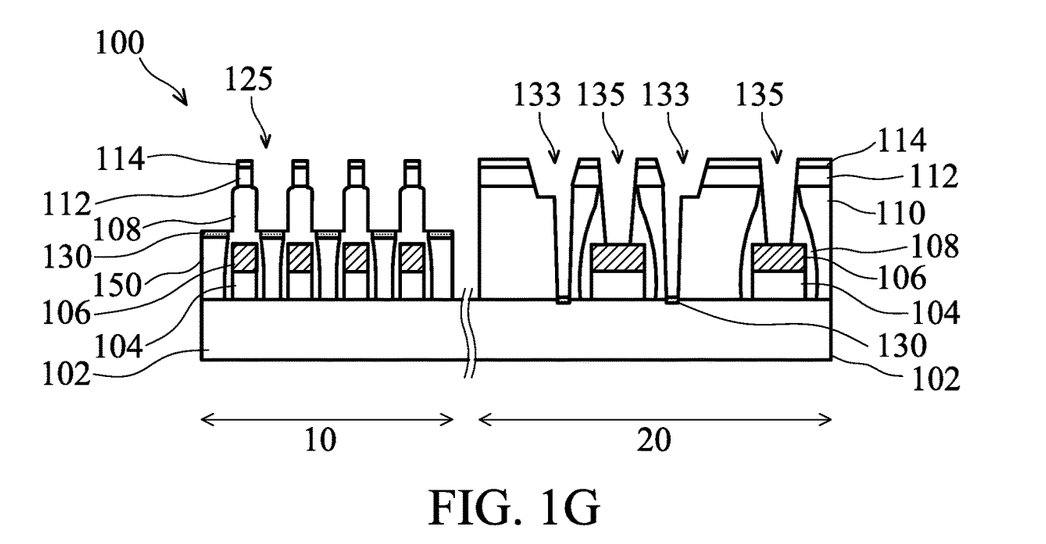

Referring to FIG. 1G, a metal silicidation reaction is performed to form a buffer layer 130 on the bottom of the self-aligned contact holes 125, the bottom of the gate contact holes 135, and the bottom of the source/drain contact holes 133. The buffer layer 130 may be formed by any applicable process. For example, a metal (such as, cobalt or tungsten) may be deposited on the surface of the silicon, and then, the metal reacts with the silicon to form a metal silicide by annealing at a specific high temperature. The resulted metal silicide is the material that forms the buffer layer 130.

Figure 1H:
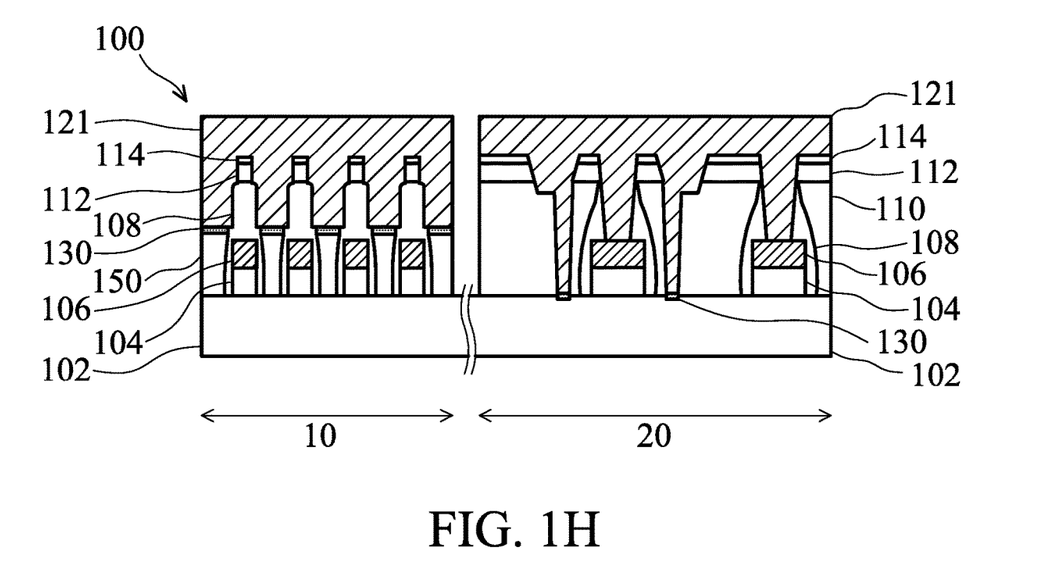

Referring to FIG. 1H, a second conductive material 121 is deposited on the self-aligned contact holes 125, the gate contact holes 135, and the source/drain contact holes 133. The second conductive material 121 may include metal, such as, tungsten, aluminum, copper, gold, silver, an alloy thereof, or another applicable metal material.

The first conductive material is a non-metallic conductive material, and the second conductive material 121 is a metal material. The adhesion between the first conductive material and the second conductive material 121 is not good, and the conductivity of the first conductive material and that of the second conductive material 121 are also significantly different. By forming the buffer layer 130, the adhesion between the first conductive material and the second conductive material 121 can be improved, and the abrupt variation of the electrical resistance value can be avoided.

Figure 1I:
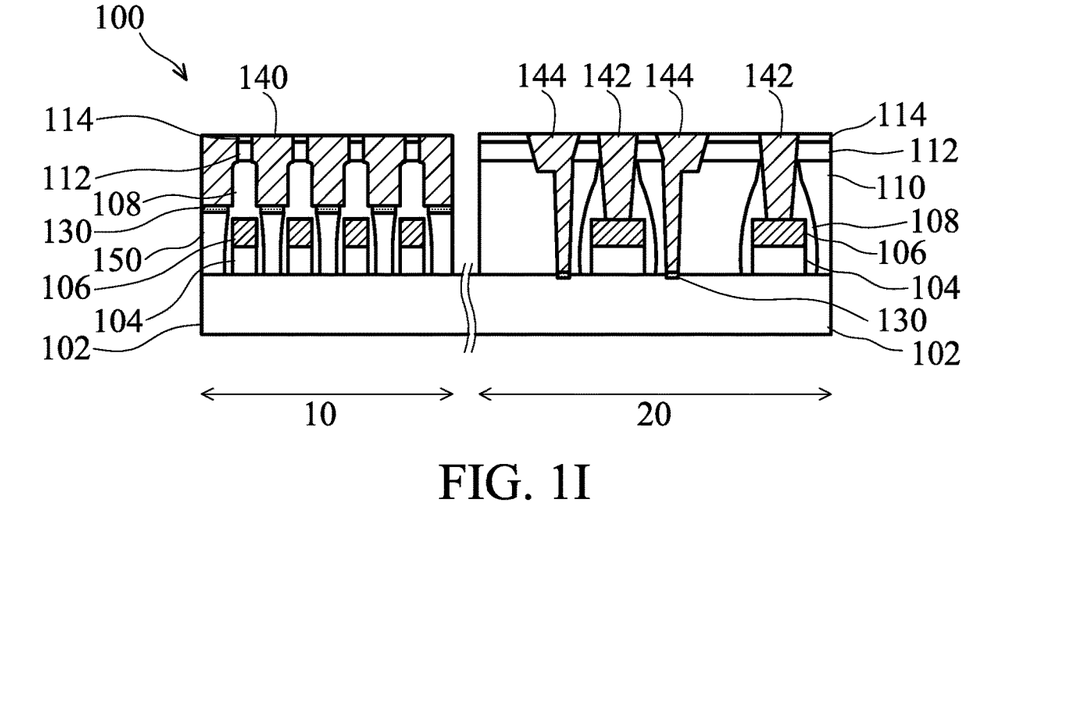

Referring to FIG. 1I, a planarization process is performed to remove a portion of the second conductive material 121, so that second contact elements 140 are formed in the self-aligned contact hole 125, and gate contact plugs 142 and source/drain contact plugs 144 are respectively formed in the gate contact holes 135 and the source/drain contact holes 133.

As shown in FIG. 1I, the bottom surface of the second contact element 140 is higher than the top surface of the first gate structure. Both the second contact element 140 and the metal gate 106 include metal material having good conductivity. Therefore, if the second contact element 140 is too close to the first gate structure, electrical interference may occur during operation.

Figure 1J:
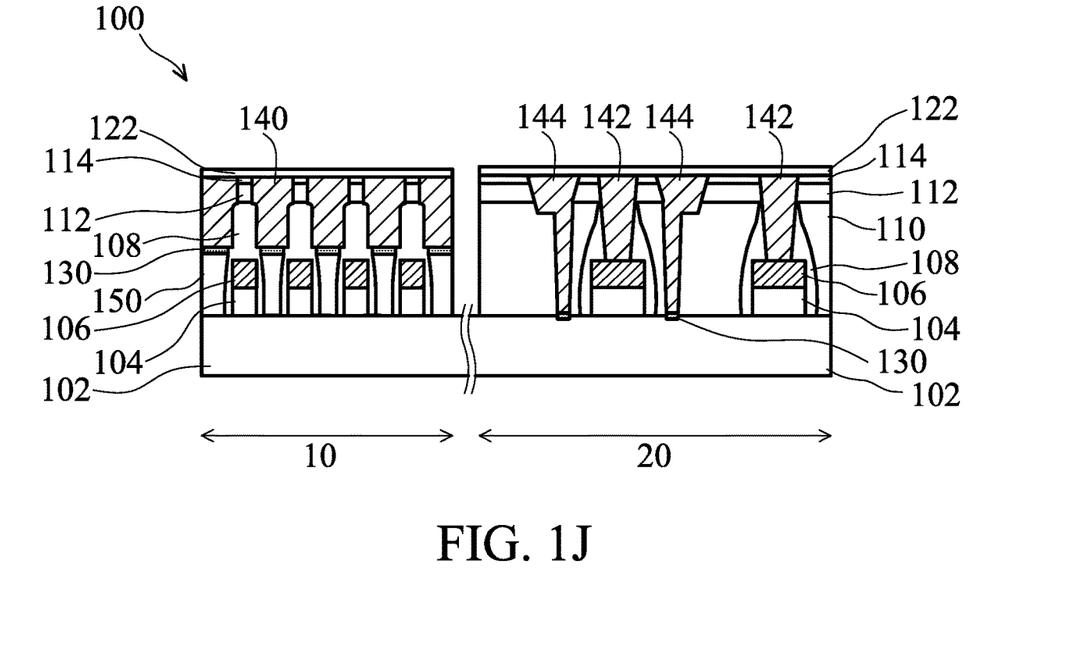

Referring to FIG. 1J, a fourth insulating layer 122 is formed in the array region 10 and the peripheral region 20. In some embodiments, the fourth insulating layer 122 and the third insulating layer 114 may use the same material. In this embodiment, the fourth insulating layer 122 is a nitride (such as, silicon nitride).

Figure 1K:
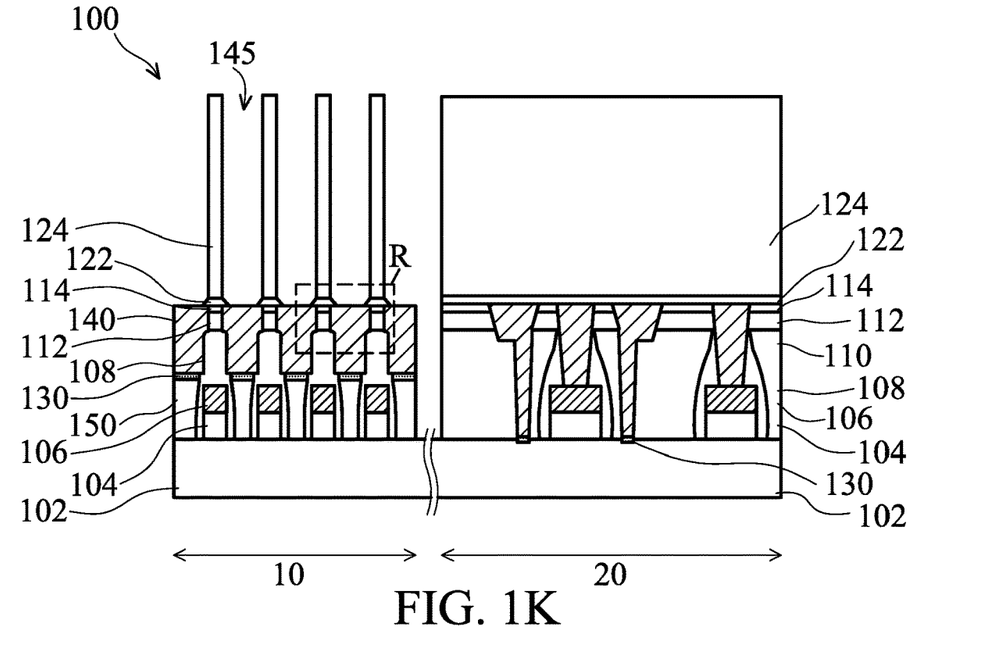

Referring to FIG. 1K, a fifth insulating layer 124 is formed on the fourth insulating layer 122. In some embodiments, the fifth insulating layer 124 and the second insulating layer 112 may use the same material. In this embodiment, the fifth insulating layer 124 is an oxide (such as, silicon oxide).

Then, a patterned mask layer (not shown) is formed on the fifth insulating layer 124 in the array region 10. A fourth etching process is performed to remove a portion of the fifth insulating layer 124 and a portion of the fourth insulating layer 122, so that a plurality of holes 145 are formed on the top surfaces of the second contact elements 140 in the fifth insulating layer 124. Each hole 145 is located on one of the second contact elements 140, and each hole 145 exposes a portion of the top surface of one second contact element 140, so that the fourth insulating layer 122 has a cross-sectional profile tapering upward, as shown in FIG. 1K.

Before performing the fourth etching process, a protection layer (not shown) may be formed in the peripheral region 20 to prevent the fifth insulating layer 124 in the peripheral region 20 from being damaged by the fourth etching process. After the fourth etching process, the protection layer on the peripheral region 20 may be removed to expose the fifth insulating layer 124. As a result, the structure shown in FIG. 1K can be obtained.

The fourth etching process may be dry etching, wet etching, or a combination thereof. The fourth etching process may have an applicable etching selectivity for the fifth insulating layer 124 and the fourth insulating layer 122 so that a portion of the fourth insulating layer 122 may remain in the hole 145. In other words, the fourth insulating layer 122 located at the bottom of the hole 145 may have a protruding portion extending inward to the hole 145.

In some embodiments, during the fourth etching process, the ratio R4/R5 of the etching rate R4 of the fifth insulating layer 124 to the etching rate R5 of fourth insulating layer 122 is 2-30. In other embodiments, the ratio R4/R5 is 5-20. In yet other embodiments, the ratio R4/R5 is 10-15.

In some embodiments, the fourth etching process is a wet etching process, and the fourth insulating layer 122 have a cross-sectional profile tapering upward, as shown in FIG. 1K. Such fourth insulating layer 122 is helpful to significantly improve the yield of the memory device, and the details will be discussed in the following paragraphs.

Figure 1L:
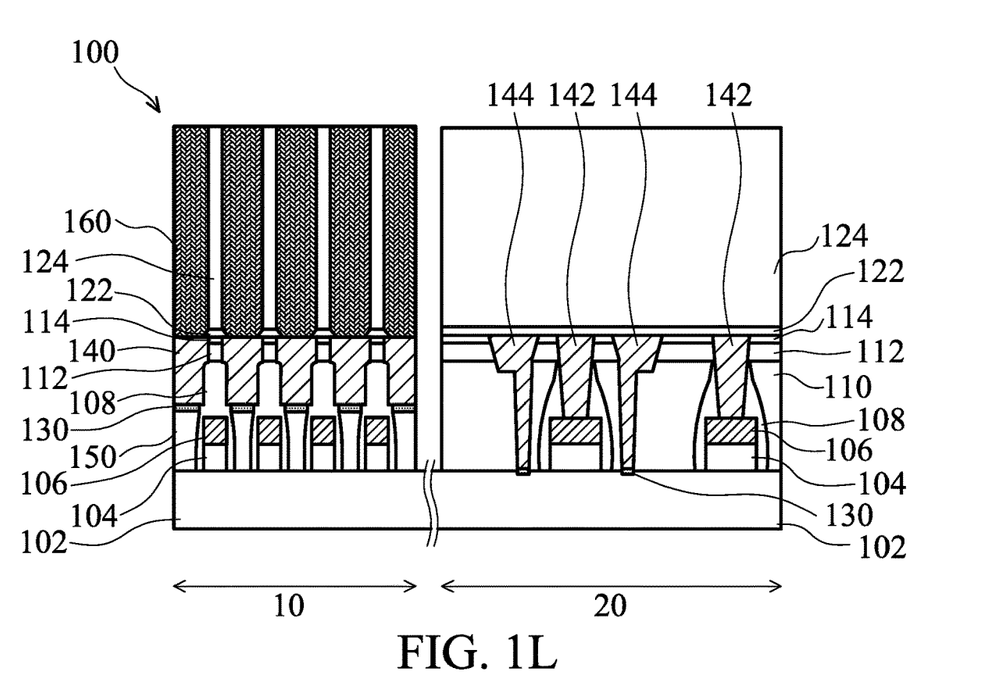

Referring to FIG. 1L, capacitor structures 160 are formed in the holes 145. The bottom surface of the capacitor structure 160 is in direct contact with the top surface of the second contact element 140 so that an electrical connection between the capacitor structure 160 and the second contact element 140 is formed. The capacitor structure 160 may be formed by any conventional method, and the details will not be described here.

Figure 2:
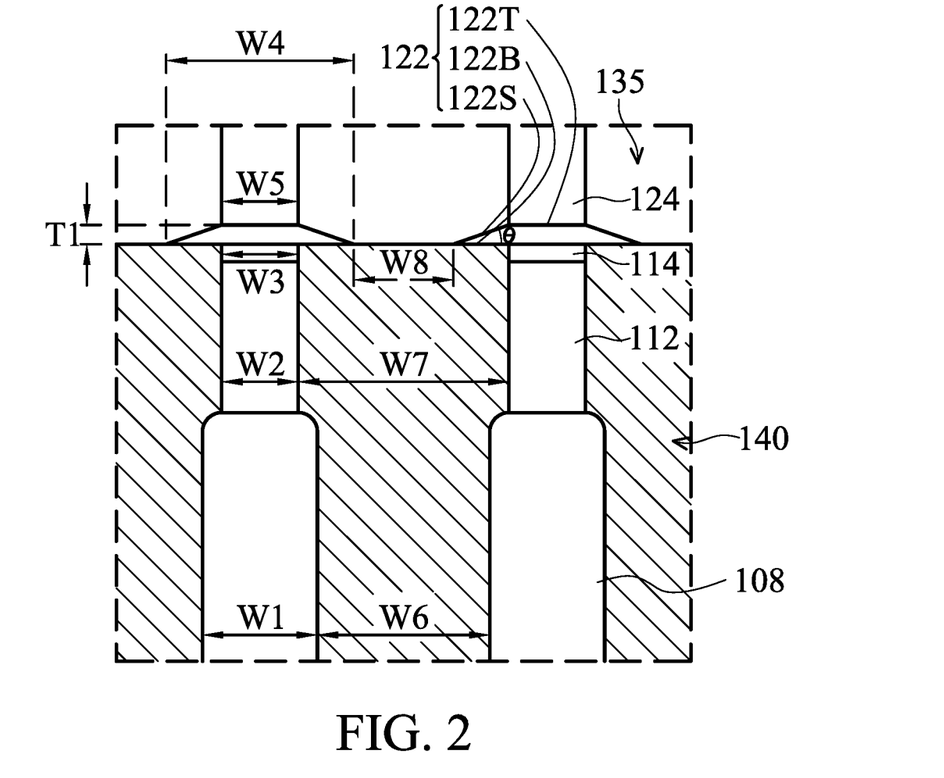
FIG. 2 shows an enlarged cross-sectional view of the region R of FIG. 1K.

FIG. 2 shows an enlarged cross-sectional view of the region R of FIG. 1K. Referring to FIG. 2 and FIG. 1K, the second contact element 140 may include a first portion, a second portion, and a third portion. The first portion (i.e., the upper portion) extends downward from the bottom surface 122B of the fourth insulating layer 122. The second portion (i.e., the lower portion) extends upward from the top surface of the buffer layer 130. The third portion (i.e., the middle portion) is located between and adjoining the first portion and the second portion, and the third portion tapers toward the second portion.

The second portion of the second contact element 140 is located between two first gate structures. If the width of the second portion is too large, the second contact element 140 and the first gate structure may be too close, which may result in operational errors. In order to avoid such operational errors, the first insulating layer 108 between the lower portion of the second contact element 140 and the metal gate 106 may be thickened. However, as the first insulating layer 108 becomes thicker, the distance between two first gate structures will increase. In other words, if the width of the second portion is too large, the distance between the adjacent first gate structures cannot be reduced. As a result, the critical dimension cannot be reduced, which is disadvantageous to the miniaturization of the memory device.

On the other hand, in the fourth etching process for forming the holes 145, the second contact element 140 may serve as an etching stop layer and the second insulating layer 112 and the third insulating layer 114 can be protected from being removed by the fourth etching process. However, the width of the hole 145 is close to the width of the second contact element 140. If the position of the second contact element 140 is not aligned with the position of the hole 145 during the fourth etching process, the fourth etching process may remove the second insulating layer 112 and the third insulating layer 114 located at both sides of the second contact element 140. Then, when the holes 145 are filled with the conductive material for forming the capacitor structure, the conductive material may fill into the second insulating layer 112 and the third insulating layer 114. As a result, the operational errors of the memory device may occur, which may result in a decrease in the yield of the final product. Such problem will become more serious when the critical dimension is reduced. In addition, in order to align the second contact element 140 with the hole 145 more precisely, the manufacturing process may be extremely difficult and extra time and cost may be required.

In order to solve the foregoing problems, the second contact element 140 in the disclosure has a second portion with a smaller width. Therefore, it is advantageous to the reduction of the critical dimension and the miniaturization of the memory device. On the other hand, because the second contact element 140 has a first portion with a larger width, it becomes easier to align the second contact element 140 with the hole 145 (i.e., the process window is larger), so that the yield of the final product is improved. Therefore, it is helpful to improve the balance between the yield and the critical dimension of the memory device.

Referring to FIG. 1C and FIG. 2, after the first etching process, the width of the third insulating layer 114 is W3. After the second etching process, the width W2 of the second insulating layer 112 is substantially equal to the width W3 of the third insulating layer 114. On the other hand, because the second etching process scarcely reduces the width of the first insulating layer 108, the width W1 of the first insulating layer 108 is greater the than width W2 of the second insulating layer 112. As a result, for the self-aligned contact hole 125 formed by the second etching process, the width W6 of the lower portion is smaller than the width W7 of the upper portion.

The shape of the second contact element 140 corresponds to and is the same as the shape of the self-aligned contact hole 125. Therefore, the shape of the self-aligned contact hole 125 (or the second contact element 140) can be easily adjusted by controlling the parameters of the second etching process. As a result, the use of the photomask and the number of photolithography processes can be reduced, thereby simplifying the process and reducing the production cost.

In other words, as shown in FIG. 2, by adjusting the ratio W7/W6 of the width W7 of the top surface of the second contact element 140 to the width W6 of the bottom surface of the second contact element 140 to a specific range, the balance between the yield and the critical dimension of the memory device may be improved. In some embodiments, the ratio W7/W6 is 1.1-1.5. In other embodiments, the ratio W7/W6 is 1.2-1.4. In yet other embodiments, the ratio W7/W6 is 1.3.

In some embodiments, the fourth etching process is a wet etching process, and it is probable that the etching solution will penetrate the interface of the second contact element 140 and the third insulating layer 114 thereby reaching the second insulating layer 112. Therefore, a portion of the second insulating layer 112 will be removed, and voids may be created in the second insulating layer 112. When the capacitor structure 160 is formed, the conductive material may fill into the voids thereby reducing the insulating property of the second insulating layer 112. As a result, the operational errors of the memory device may occur, which will result in a decrease in the yield of the final product.

Referring to FIG. 2, the width W4 of the bottom surface of the fourth insulating layer 122 is greater than the width W3 of the top surface of the third insulating layer 114. In other words, the fourth insulating layer 122 covers the interface of the second contact element 140 and the third insulating layer 114. Furthermore, the bottom surface of the fourth insulating layer 122 is level with and in direct contact with the top surface of the second contact element 140, as shown in FIG. 2. Because the etching rate of the fourth insulating layer 122 during the fourth etching process is slower, the fourth insulating layer 122 having the specific shape can reduce or prevent the etching solution penetrating the interface and reaching the second insulating layer 112. As a result, the foregoing problems of the operational errors of the memory device can be significantly improved.

Furthermore, the fourth insulating layer 122 has the cross-sectional profile tapering upward, as shown in FIG. 2.

Because the shape of the bottom of the hole 145 corresponds to the shape of the fourth insulating layer 122, the bottom of the hole 145 has a cross-sectional profile tapering downward. In other words, the width of the bottom of the hole 145 is smaller than the width of the upper portion.

If the hole 145 has a uniform width from the top to the bottom, it is difficult to achieve the balance between the yield and the critical dimension of the memory device. More specifically, if the width of the hole 145 is too large, the alignment of the second contact element 140 with the hole 145 becomes very difficult, and the critical dimension cannot be reduced. Therefore, it is disadvantageous to the miniaturization of the memory device. On the other hand, if the width of the hole 145 is too small, the aspect ratio of the hole 145 is too high, so that it is difficult to fill the hole 145 with the material for forming the capacitor structure 160. Therefore, the yield of the final product may be reduced.

Because the hole 145 has the lower portion with a smaller width, it is advantageous to the alignment of the second contact element 140 with the hole 145, and it is also advantageous to the reduction of the critical dimension and the miniaturization of the memory device. On the other hand, because the hole 145 has the upper portion with a larger width, it becomes easier to form the capacitor structure (i.e., to fill the hole 145), so that the yield of the final product is improved. Therefore, it is helpful to improve the balance between the yield and the critical dimension of the memory device.

The ratio of the width W4 of the bottom surface 122B of the fourth insulating layer 122 to the width W5 of the top surface 122T of the fourth insulating layer 122 is W4/W5, as shown in FIG. 2. In other words, by adjusting the ratio W4/W5 to a specific range, the balance between the yield and the critical dimension of the memory device may be further improved. In some embodiments, the ratio W4/W5 is 1.1-3.0. In other embodiments, the ratio W4/W5 is 1.3-2.5. In yet other embodiments, the ratio W4/W5 is 1.5-2.0.

In the structure shown in FIG. 2, the thickness and the cross-sectional profile of the fourth insulating layer 122 are also important parameters that affect the yield of the memory device 100.

Referring to FIG. 2, the fourth insulating layer 122 has a maximum thickness T1. If the maximum thickness T1 is too small, the protruding portion of the fourth insulating layer 122 located on the bottom of the hole 145 may be too thin, so that the etching solution cannot be effectively blocked and the second insulating layer 112 cannot be protected. On the other hand, if the maximum thickness T1 is too large, it is difficult to remove sufficient fourth insulating layer 122 by the fourth etching process to form an opening exposing the second contact element 140. Therefore, in order to improve the yield, the maximum thickness T1 of the fourth insulating layer 122 may be controlled within a specific range. In some embodiments, the maximum thickness T1 of the fourth insulating layer is 10-60 nm. In other embodiments, the maximum thickness T1 is 20-50 nm. In yet other embodiments, the maximum thickness T1 is 30-40 nm.

As shown in FIG. 2, there is an included angle θ between the sidewall 122S of the fourth insulating layer 122 and the bottom surface 122B of the fourth insulating layer 122. The included angle θ may be used to describe the cross-sectional profile of the fourth insulating layer 122.

If the included angle θ is too small, it indicates that the fourth insulating layer 122 tapers off smoothly. Therefore, the protruding portion of the fourth insulating layer 122 is too thin to effectively block the etching solution and to protect the second insulating layer 112. Furthermore, when the maximum thickness T1 of the fourth insulating layer 122 is fixed, the smaller included angle θ indicates that the area of the second contact element 140 exposed by the hole 145 is smaller (i.e., the width W8 is smaller). Therefore, the electrical resistance value between the capacitor structure 160 and the second contact element 140 will be increased, and it is disadvantageous to the operation of the memory device 100. On the other hand, if the included angle θ is too large, it indicates that the fourth insulating layer 122 tapers off abruptly. Therefore, when the maximum thickness T1 of the fourth insulation layer 122 is fixed, the larger included angle θ indicates that the protruding portion of the fourth insulating layer 122 is shorter (or narrower). Therefore, the etching solution cannot be effectively blocked and the second insulating layer 112 and the third insulating layer 114 cannot be protected. Furthermore, the larger included angle θ indicates that the area of the second contact element 140 exposed by the hole 145 is larger (i.e., the width W8 is larger). Therefore, the alignment of the second contact element 140 with the hole 145 becomes difficult, and it is advantageous to improve the yield of the final product. Therefore, in order to improve the yield, the included angle θ may be controlled within a specific range. In some embodiments, the included angle θ is 20-60 degrees. In other embodiments, the included angle θ is 30-50 degrees.

In addition, in some embodiments, after forming the opening 127 with a smaller width by the second etching process, the width of the upper portion of the opening 127 is increased by the third etching process to form the source/drain contact hole 133. Because the width of the lower portion of the source/drain contact hole 133 is smaller, the available area of the substrate 102 occupied by the source/drain contact hole 133 may be reduced. Therefore, it is advantageous to the miniaturization of the memory device. On the other hand, because the width of the upper portion of the source/drain contact hole 133 is larger, it will be easier to fill the second conductive material 121 and the formation of voids in the source/drain contact plug 144 will be reduced. Therefore, it is advantageous to reduce the electrical resistance value of the source/drain contact plug 144. In the disclosure, the source/drain contact plug 144 having the foregoing cross-sectional profile may be simply formed by the second etching process and the third etching process. In comparison with the conventional technique, the process steps may be simplified and the production cost may be reduced.

In some embodiments of the disclosure, a memory device is provided. Referring to FIG. 1L, the memory device 100 includes a substrate 102 including an array region 10 and a peripheral region 20. In the array region 10, a plurality of first gate structures are formed on the substrate 102, and a multilayer insulating structure is formed on the first gate structures. The multilayer insulating structure includes a first insulating layer 108, a second insulating layer 112, a third insulating layer 114 and a fourth insulating layer 122 sequentially from the bottom to the top. The first insulating layer 108 is formed on and covers the first gate structures.

Referring to FIG. 2, the width W2 of the second insulating layer 112 is smaller than the width W1 of the first insulating layer 108. The width W3 of the third insulating layer 114 is the same as the width W2 of the second insulating layer 112. The width W4 of the bottom surface of the fourth insulating layer 122 is greater than the width W3 of the top surface of the third insulating layer 112. The width W4 of the bottom surface of the fourth insulating layer 122 is greater than the width W5 of the top surface of the fourth insulating layer 122. The relationship between the thicknesses of the first insulating layer 108, the second insulating layer 112, the third insulating layer 114, and the fourth insulating layer 122 can be adjusted by selecting applicable materials and controlling the parameters of the second etching process.

There are a plurality of capacitor contact plugs in the array region 10, and each capacitor contact plug is formed between two adjacent first gate structures. The capacitor contact plug includes a first contact element 150, a buffer layer 130, and a second contact element 140 sequentially from the bottom to the top. The second contact element 140 includes a first portion extending downward from the bottom surface of the fourth insulating layer, a second portion extending upward from the top surface of the buffer layer 130, and a third portion formed between the first portion and the second portion. The third portion adjoins the first portion and the second portion and tapers toward the second portion. The width W7 of the top surface of the second contact element 140 is greater than the width W6 of the bottom surface of the second contact element 140, as shown in FIG. 2.

Referring to FIG. 1L, fifth insulating layers 124 are formed in the array region 10, and a plurality of capacitors structure 160 are formed between the fifth insulating layers 124. Each capacitor structure 160 is formed on a capacitor contact plug, and the position of the capacitor structure 160 corresponds to the position of the capacitor contact plug. Referring to FIG. 2, the width of the fifth insulating layer 124 is equal to width W5 of the top surface of the fourth insulating layer 122. The width W8 of the bottom surface of the capacitor structure 160 is smaller than the width W7 of the top surface of the second contact element 140.

Still referring to in FIG. 1L, a plurality of second gate structure are formed in the peripheral region 20. A gate contact plug 142 is formed on the second gate structure, and the position of the gate contact plug 142 corresponds to the position of the second gate structure. Two source/drain contact plugs 144 are respectively formed at both sides of the second gate structure. The source/drain contact plug 144 includes an upper portion and a lower portion, and the width of the bottom surface of the upper portion is greater than the width of the top surface of the lower portion.

As mentioned above, in some embodiments, by controlling the cross-sectional profiles of the second contact element 140 and the fourth insulating layer 122, the balance between the yield and the critical dimension of the memory device can be significantly improved.

Referring to FIG. 2, in some embodiments, the fourth insulating layer 122 has a top surface 122T, a bottom surface 122B, and two sidewalls 122S. The sidewall 122S is linear, and there is an included angle θ between the sidewall 122S and the bottom surface 122B. However, the cross-sectional profile of the fourth insulating layer 122 is not limited to this shape.

Figure 3:
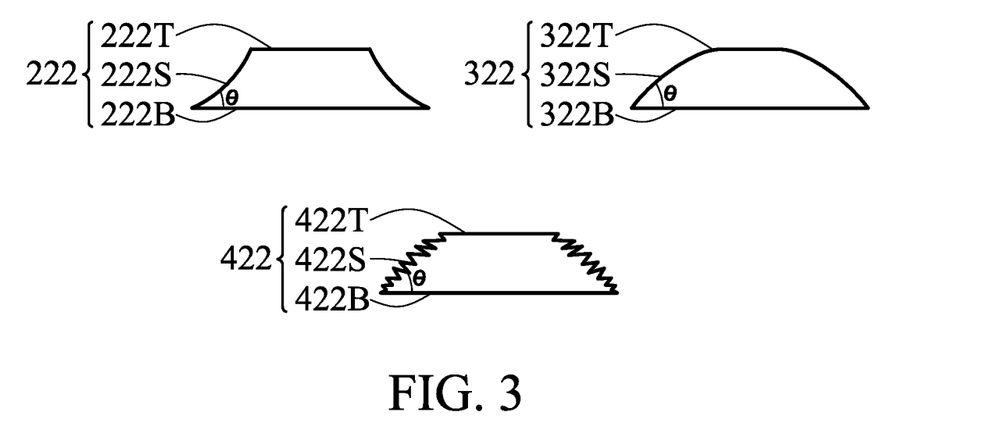
FIG. 3 shows cross-sectional views of the fourth insulating layer in accordance with some embodiments.

FIG. 3 shows cross-sectional views of the fourth insulating layer in accordance with some embodiment. The fourth insulating layer 222 shown in FIG. 3 has a top surface 222T, a bottom surface 222B, and two sidewalls 222S, and there is an included angle θ between the sidewall 222S and the bottom surface 222B. Referring to FIG. 2 and FIG. 3, the fourth insulating layer 222 shown in FIG. 3 is similar to the fourth insulating layer 122 shown in FIG. 2, and the difference is that the sidewall 222S shown in FIG. 3 has a concave and curvilinear cross-sectional profile. Furthermore, the sidewall 322S of the fourth insulating layer 322 shown in FIG. 3 has a convex and curvilinear cross-sectional profile. In addition, the sidewall 422S of the fourth insulating layer 422 shown in FIG. 3 has a irregular and zigzag cross-sectional profile. The cross-sectional profile of the fourth insulating layer shown in FIG. 2 and FIG. 3 are merely examples and are not intended to be limiting. Therefore, the cross-sectional profile of the fourth insulating layer may be linear, curvilinear, zigzag, irregular, or a combination thereof.

In conclusion, some embodiments in this disclosure provide a memory device with improved yield and critical dimensions. Furthermore, some embodiments in this disclosure provide a low-cost and high-efficiency manufacturing method that can be used to manufacture a memory device with improved yield and critical dimensions.

More specifically, the memory device and its manufacturing method of the embodiments in this disclosure at least include the following advantages:

(1) The second contact element includes the lower portion with smaller width so that the critical dimension can be reduced. Therefore, it is advantageous to the miniaturization of the memory device.

(2) The second contact element includes the upper portion with larger width so that the alignment of the second contact element with the capacitor structure becomes easier (i.e., the process window can be improved). Therefore, the yield of the final product can be improved.

(3) The capacitor structure includes the lower portion tapering downward so that the process window can be further improved. Therefore, the yield of the final product can be improved.

(4) The fourth insulating layer covers the interface of the third insulating layer and the second contact element, and the width of the bottom surface of the fourth insulating layer is greater than the width of the top surface of the third insulating layer. Therefore, the etching solution can be effectively blocked and the second insulating layer can be protected. As a result, the yield of the final product can be further improved.

(5) The fourth insulating layer has the cross-sectional profile tapering upward. Therefore, the etching solution can be effectively blocked and the second insulating layer can be protected. Furthermore, the alignment of the second contact element with the capacitor structure becomes easier. As a result, the yield of the final product can be significantly improved.

(6) The relationship between the thicknesses of the first insulating layer, the second insulating layer, the third insulating layer, and the fourth insulating layer can be adjusted by selecting applicable materials and controlling the parameters of the second etching process. Therefore, the insulating layers having different widths can be formed without complicated process steps. As a result, time and cost of production can be reduced.

(7) The manufacturing method of the memory device of the embodiments in this disclosure can be easily integrated with the existing manufacturing process of the memory device without additional replacement or modification of manufacturing equipment. Therefore, while the process complexity and the cost of production are reduced, the yield and the critical dimension of the memory device can be effectively improved.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A memory device, comprising:
   a substrate, wherein the substrate comprises an array region and a peripheral region;
   two first gate structures formed in the array region;
   a multilayer insulating structure formed on the first gate structures, wherein the multilayer insulating structure comprises:
      a first insulating layer formed on and covering the first gate structures;
      a second insulating layer formed on the first insulating layer, wherein a width of the second insulating layer is smaller than a width of the first insulating layer;
      a third insulating layer formed on the second insulating layer, wherein a width of the third insulating layer is the same as the width of the second insulating layer; and
      a fourth insulating layer formed on the third insulating layer, wherein a width of a bottom surface of the fourth insulating layer is greater than a width of a top surface of the third insulating layer; and
   a capacitor contact plug formed between the first gate structures, wherein the capacitor contact plug comprises:
      a first contact element formed on the substrate;
      a second contact element formed on the first contact element, wherein a width of a top surface of the second contact element is greater than a width of a bottom surface of the second contact element; and
      a buffer layer formed between the first contact element and the second contact element.

2. The memory device as claimed in claim 1, wherein the bottom surface of the fourth insulating layer is level with and in direct contact with the top surface of the second contact element.

3. The memory device as claimed in claim 1, wherein the fourth insulating layer has a cross-sectional profile tapering upward.

4. The memory device as claimed in claim 1, wherein a ratio of the width of the bottom surface of the fourth insulating layer to the width of the top surface of the fourth insulating layer is 1.1-3.0.

5. The memory device as claimed in claim 1, wherein an included angle between a sidewall of the fourth insulating layer and the bottom surface of the fourth insulating layer is 20-60 degrees.

6. The memory device as claimed in claim 5, wherein the sidewall of the fourth insulating layer is linear, curvilinear, zigzag or irregular.

7. The memory device as claimed in claim 1, wherein a maximum thickness of the fourth insulating layer is 10-60 nm.

8. The memory device as claimed in claim 1, wherein the second contact element comprises:
   a first portion extending downward from the bottom surface of the fourth insulating layer;
   a second portion extending upward from a top surface of the buffer layer; and
   a third portion formed between and adjoining the first portion and the second portion, wherein the third portion tapers toward the second portion.

9. The memory device as claimed in claim 5, wherein a ratio of the width of the top surface of the second contact element and the width of the bottom surface of the second contact element is 1.1-1.5.

10. The memory device as claimed in claim 1, wherein the bottom surface of the second contact element is higher than a top surface of the first gate structure.

11. The memory device as claimed in claim 1, wherein a material of the second insulating layer is different than a material of the first insulating layer, and the material of the second insulating layer is different than a material of the third insulating layer.

12. The memory device as claimed in claim 11, wherein the first insulating layer is a nitride, the second insulating layer is an oxide, the third insulating layer is a nitride, and the fourth insulating layer is a nitride.

13. The memory device as claimed in claim 1, further comprising:
   a fifth insulating layer formed on the fourth insulating layer, wherein a material of the fifth insulating layer is different from a material of the fourth insulating layer; and
   a capacitor structure formed on the capacitor contact plug.

14. The memory device as claimed in claim 1, further comprising:
   a second gate structure formed in the peripheral region;
   a gate contact plug formed on the second gate structure;
   a source/drain contact plug formed on the substrate, wherein the source/drain contact plug comprises an upper portion and a lower portion, and a width of a bottom surface of the upper portion is greater than a width of a top surface of the lower portion.

15. A method for manufacturing a memory device, comprising:
   preparing a substrate, wherein the substrate comprises an array region and a peripheral region;
   forming two first gate structures in the array region;
   forming a multilayer insulating structure on the first gate structures, wherein the multilayer insulating structure comprises:
      a first insulating layer formed on and covering the first gate structures;
      a second insulating layer formed on the first insulating layer, wherein a width of the second insulating layer is smaller than a width of the first insulating layer;
      a third insulating layer formed on the second insulating layer, wherein a width of the third insulating layer is the same as the width of the second insulating layer; and
      a fourth insulating layer formed on the third insulating layer, wherein a width of a bottom surface of the fourth insulating layer is greater than a width of a top surface of the third insulating layer; and
   forming a capacitor contact plug between the first gate structures, wherein the capacitor contact plug comprises:
      a first contact element formed on the substrate;
      a second contact element formed on the first contact element, wherein a width of a top surface of the second contact element is greater than a width of a bottom surface of the second contact element; and
      a buffer layer formed between the first contact element and the second contact element.

16. The method for manufacturing the memory device as claimed in claim 15, wherein forming the multilayer insulating structure comprises:
   forming the second insulating layer in the array region to cover the first gate structures and the first insulating layer, wherein the second insulating layer has a flat top surface;

forming the third insulating layer on the second insulating layer, wherein the third insulating layer has a uniform thickness in the array region;

performing a first etching process to pattern the third insulating layer, wherein a width of the patterned third insulating layer is smaller than a width of the underlying first insulating layer;

performing a second etching process by using the patterned third insulating layer as a mask to remove a portion of the second insulating layer and to form an opening between the first gate structures;

filling a conductive material into the opening to form the second contact element;

forming the fourth insulating layer on the third insulating layer and the second contact element; and performing a third etching process to remove a portion of the fourth insulating layer and expose a portion of the top surface of the second contact element.

17. The method for manufacturing the memory device as claimed in claim 16, wherein a ratio of an etching rate of the second insulating layer to an etching rate of the first insulating layer is 5-40 during the second etching process.

18. The method for manufacturing the memory device as claimed in claim 16, after forming the fourth insulating layer, further comprising:

forming a fifth insulating layer on the fourth insulating layer;

performing the third etching process to remove a portion of the fourth insulating layer and the fifth insulating layer and to form a hole in the fifth insulating layer and on the top surface of the second contact element; and forming a capacitor structure in the hole, wherein a bottom surface of the capacitor structure is in direct contact with the top surface of the second contact element.

* * * * *